(12) United States Patent
Masuda et al.

(10) Patent No.: US 9,337,364 B2
(45) Date of Patent: May 10, 2016

(54) SOLID-STATE IMAGING ELEMENT AND ELECTRONIC APPARATUS

(71) Applicant: Sony Corporation, Tokyo (JP)

(72) Inventors: Yoshiaki Masuda, Kumamoto (JP); Keita Hondo, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 150 days.

(21) Appl. No.: 13/781,246

(22) Filed: Feb. 28, 2013

(65) Prior Publication Data

US 2013/0258154 A1    Oct. 3, 2013

(30) Foreign Application Priority Data

Mar. 28, 2012  (JP) ................. 2012-073725

(51) Int. Cl.
*H01L 31/0232* (2014.01)
*H01L 27/146* (2006.01)
*H01L 27/148* (2006.01)

(52) U.S. Cl.
CPC ........ *H01L 31/0232* (2013.01); *H01L 27/1462* (2013.01); *H01L 27/14629* (2013.01); *H01L 27/14806* (2013.01); *H01L 27/14818* (2013.01)

(58) Field of Classification Search
CPC ........ G02B 1/11; G02B 5/0294; G02B 5/207; H04N 5/2253; H04N 5/2254; H04N 5/2257; H04N 5/335; H04N 5/374
USPC ........................... 348/272, 294, 308
See application file for complete search history.

(56) References Cited

U.S. PATENT DOCUMENTS

| 7,816,641 | B2 * | 10/2010 | Tay et al. ............ 250/226 |
| 2009/0045477 | A1 * | 2/2009 | Narui ................. 257/432 |
| 2011/0058076 | A1 * | 3/2011 | Tanaka ............... 348/294 |

FOREIGN PATENT DOCUMENTS

JP    2006-041026 A    2/2006

* cited by examiner

*Primary Examiner* — James Hannett
*Assistant Examiner* — Padma Haliyur
(74) *Attorney, Agent, or Firm* — Hazuki International, LLC

(57) ABSTRACT

A solid-state imaging element includes a light receiving unit formed on a semiconductor base, and an anti-reflection film formed on the light receiving unit. The anti-reflection film has a plurality of planar layers whose planar layer in an upper layer is narrower than the planar layer in a lower layer.

8 Claims, 18 Drawing Sheets

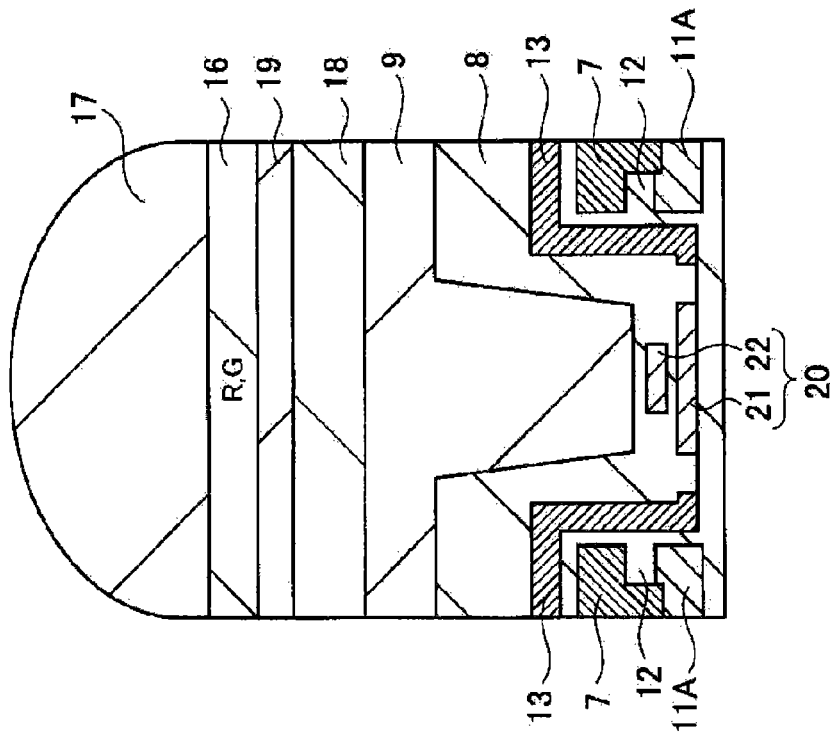
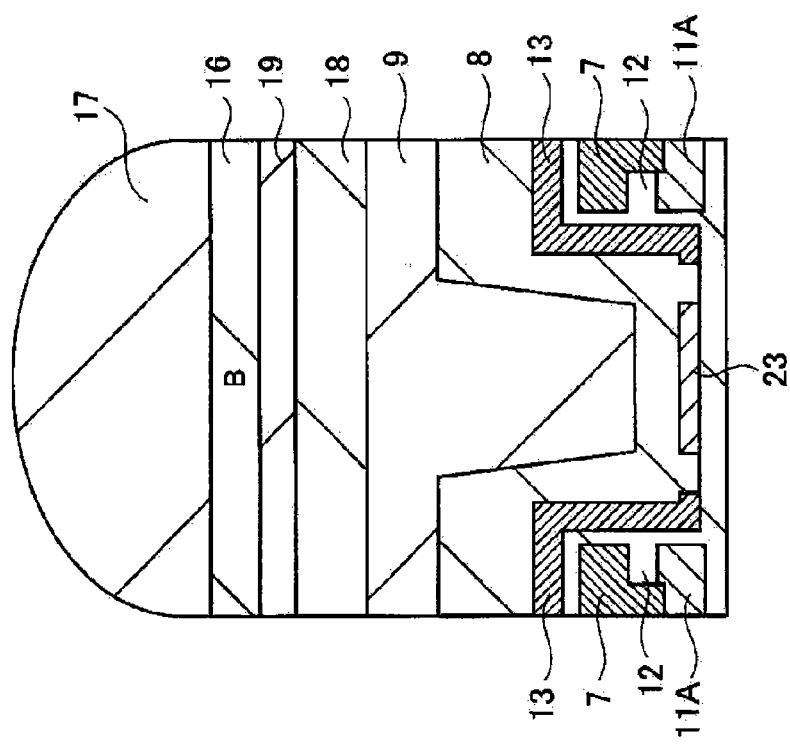
FIG.11A
FIG.11B

SOLID-STATE IMAGING ELEMENT AND ELECTRONIC APPARATUS

BACKGROUND

The present technology relates to a solid-state imaging element and an electronic apparatus having this solid-state imaging element.

From the past, a solid-state imaging element employs a configuration in which an anti-reflection film is provided on a portion where a light receiving unit of a semiconductor base is formed for suppressing sensitivity deterioration caused by reflection of light at the interface between the semiconductor base such as a silicon substrate and an insulating film thereupon.

However, when light incident on the semiconductor base from an oblique direction is incident on an end portion of the anti-reflection film, the light passes through the anti-reflection film and then, some of the light is not incident on the light receiving unit, reflects on a surface of the semiconductor base, and directs outside the anti-reflection film. As a result, this tends to provide troubles such as a smear phenomenon and color mixing.

In order to cope with this problem, a method of forming an anti-reflection film in an upwardly-convex shape has been proposed (for example, see Japanese Patent Application Laid-Open No. 2006-41026).

According to this structure, refracting the light on the curved surface enables the light to focus on a central portion of the light receiving unit, so that the smear can be reduced.

SUMMARY

In order to form the anti-reflection film in an upwardly-convex shape as the configuration described in Japanese Patent Application Laid-Open No. 2006-41026, a resist having a curved surface is formed by thermal reflow on a material film of the anti-reflection film and the shape of the resist needs to be transferred to the material film of the anti-reflection film.

However, since the curved shape of the resist formed by the thermal reflow is transferred, a formable dimension and shape is limited. For example, it is difficult to form a thin anti-reflection film or a narrow anti-reflection film.

Moreover, since the curved shape of the resist is transferred by an etch back, it is necessary to thicken an interlayer insulating film, which serves as a stopper film, in a lower layer of the anti-reflection film.

Accordingly, in the anti-reflection film, a design of a light focusing condition and an anti-reflection condition is limited and it is difficult to optimize these conditions.

It is desirable to provide a solid-state imaging element which is capable of focusing incident light by the anti-reflection film and providing a higher degree of freedom in designing the anti-reflection film. Moreover, it is desirable to provide an electronic apparatus having the solid-state imaging element.

A solid-state imaging element according to an embodiment of the present technology includes a light receiving unit formed on a semiconductor base, and an anti-reflection film formed on the light receiving unit. The anti-reflection film has a plurality of planar layers whose planar layer in an upper layer is narrower than the planar layer in a lower layer.

An electronic apparatus according to an embodiment of the present technology includes an optical system, a solid-state imaging element, and a signal processing circuit configured to process an output signal of the solid-state imaging element, in which the solid-state imaging element has a configuring of the solid-state imaging element according to an embodiment of the present technology described above.

With the configuration of the solid-state imaging element according to an embodiment of the present technology described above, since the anti-reflection film includes the plurality of planar layers and the planar layer in a upper layer is narrower than the planar layer in a lower layer, the anti-reflection film has a lens effect which collects light incident from above. Accordingly, focusing the light passed through the anti-reflection film on the light receiving unit can suppress the occurrence of smear and color mixing.

Then, since reflection on the surface of the semiconductor base can be suppressed by the anti-reflection film, sensitivity deterioration caused by the reflection can be suppressed.

Moreover, since the anti-reflection film is formed of the plurality of planar layers, processing is facilitated when the anti-reflection film is formed.

With the electronic apparatus according to an embodiment of the present technology described above, the electronic apparatus includes the solid-state imaging element according to an embodiment of the present technology, so that it is possible to suppress the occurrence of smear and color mixing and sensitivity deterioration caused by the reflection in the solid-state imaging element.

According to an embodiment of the present technology described above, since it is possible to suppress the occurrence of smear and color mixing by the anti-reflection film, image quality can be improved.

Moreover, since the anti-reflection film can suppress the sensitivity deterioration caused by the reflection, sufficient sensitivity can be obtained.

Further, since the processing is facilitated when the anti-reflection film is formed, the width, thickness, and number of the planar layers constituting the anti-reflection film can be selected arbitrarily and a higher degree of freedom in designing the anti-reflection film can be provided.

These and other objects, features and advantages of the present disclosure will become more apparent in light of the following detailed description of best mode embodiments thereof, as illustrated in the accompanying drawings.

BRIEF DESCRIPTION OF DRAWINGS

FIGS. 11A and 11B are schematic configuration diagrams (cross-sectional views) of a solid-state imaging element according to a third embodiment;

DETAILED DESCRIPTION OF EMBODIMENTS

Hereinafter, suitable embodiments for carrying out the present technology (hereafter referred to as embodiments) will be described below.

In this regard, explanations will be made in the following order.
1. First Embodiment (solid-state Imaging Element)
2. Second Embodiment (solid-state Imaging Element)
3. Third Embodiment (solid-state Imaging Element)
4. Fourth Embodiment (solid-state Imaging Element)
5. Fifth Embodiment (solid-state Imaging Element)
6. Sixth Embodiment (Electronic Apparatus)

1. First Embodiment

Solid-State Imaging Element

Figure 1:
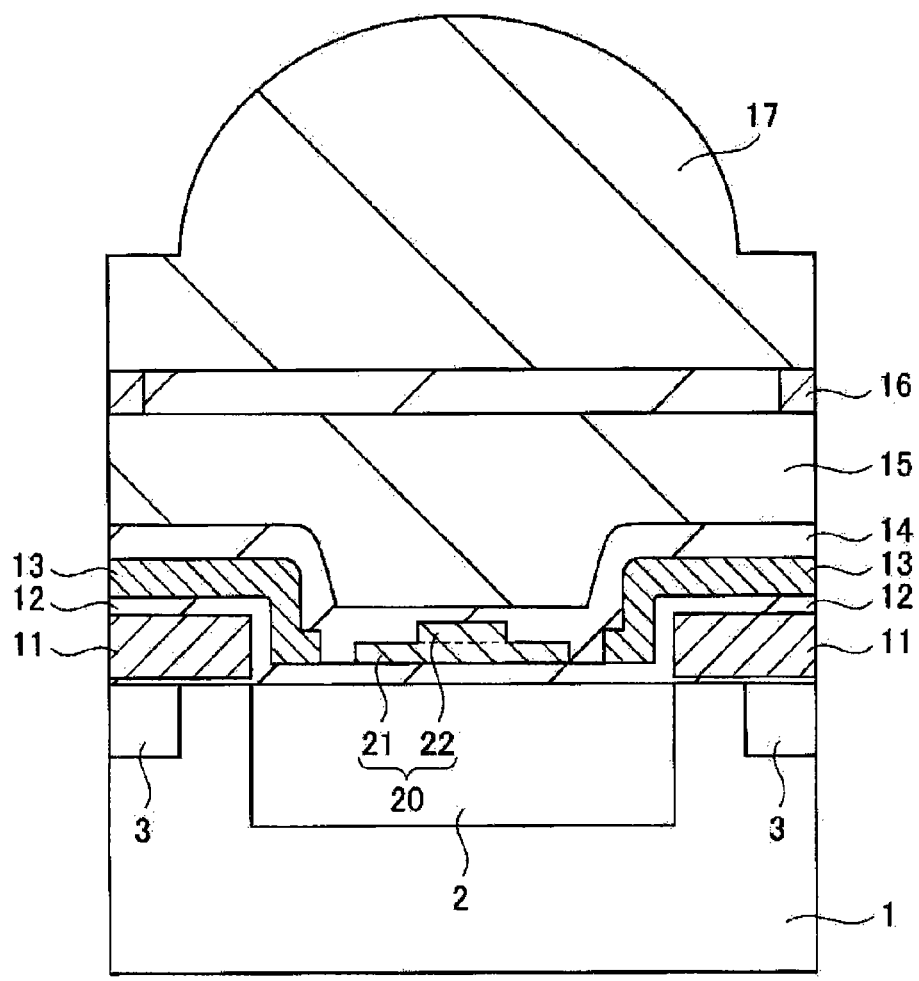
FIG. 1 is a schematic configuration diagram (cross-sectional view) of a solid-state imaging element according to a first embodiment.

FIG. 1 shows a schematic configuration diagram (cross-sectional view) of a solid-state imaging element according to a first embodiment.

The present embodiment exemplifies a case where the present technology is applied to a CCD (charge coupled device) solid-state imaging element.

As shown in FIG. 1, in the solid-state imaging element according to the present embodiment, a light receiving unit 2, made of a photodiode, for performing a photoelectric conversion by incident light, is formed inside a semiconductor base 1 made of a semiconductor material such as silicon.

Examples of the semiconductor base 1 include a single semiconductor substrate, a semiconductor substrate and an epitaxial layer formed thereon, and a semiconductor layer formed on other substrates.

On the semiconductor base 1 positioned outside the light receiving unit 2 shown in FIG. 1, transfer electrodes 11 for transferring electric charge photoelectrically converted by the light receiving unit 2 are formed. Inside the semiconductor base 1 under the transfer electrodes 11, vertical transfer registers 3 are formed. Between each transfer electrode 11 and the semiconductor base 1, a thin gate insulating film is formed.

On the transfer electrodes 11 and the semiconductor base 1, an interlayer insulating films 12 is formed.

On the interlayer insulating films 12, light-shielding films 13 are formed so as to cover over and around the transfer electrodes 11. The light-shielding films 13 include an opening on the light receiving unit 2.

On the light-shielding films 13, a passivation film 14 is formed. On the passivation film 14, a planarizing layer 15 having a flattened surface is formed.

On the planarizing layer 15, a color filter 16 and a microlens 17 are formed.

In the present embodiment, an anti-reflection film 20 having a convexed cross-sectional shape is provided specifically in the opening of the light-shielding films 13 on a central portion of the light receiving unit 2.

The convex shaped anti-reflection film 20 includes a two-layer structure in which two planar layers made of a lower stage 21 having a wide lower layer and an upper stage 22 having a narrow upper layer are stacked.

Thus-structured convex shaped anti-reflection film 20 has an anti-reflection effect with respect to light incident from above and a lens effect to collect the incident light.

In the anti-reflection film 20, a high-refractive index material is used for the interlayer insulating film 12 in a lower layer and the layers formed on the anti-reflection film 20. In the present embodiment, a high-refractive index material is used for the passivation film 14.

For example, the interlayer insulating films 12 and the passivation film 14 can be made of a silicon oxide film. The anti-reflection film 20 can be made of a silicon nitride film (SiN film), a silicon oxynitride film (SiON film), a silicon carbonitride film (SiCN film), and the like having a refractive index higher than that of the silicon oxide film.

Moreover, oxides such as ITO (indium-tin oxide) and TiOx (titanium oxid) used in polyimide resin, poly-crystalline silicon, and a transparent electrode also has a refractive index higher than that of the silicon oxide film, so that these oxides can be used for the anti-reflection film 20.

Now referring to FIG. 2, the convex shaped anti-reflection film 20 and a dimension of each portion at its periphery will be described.

Figure 2:
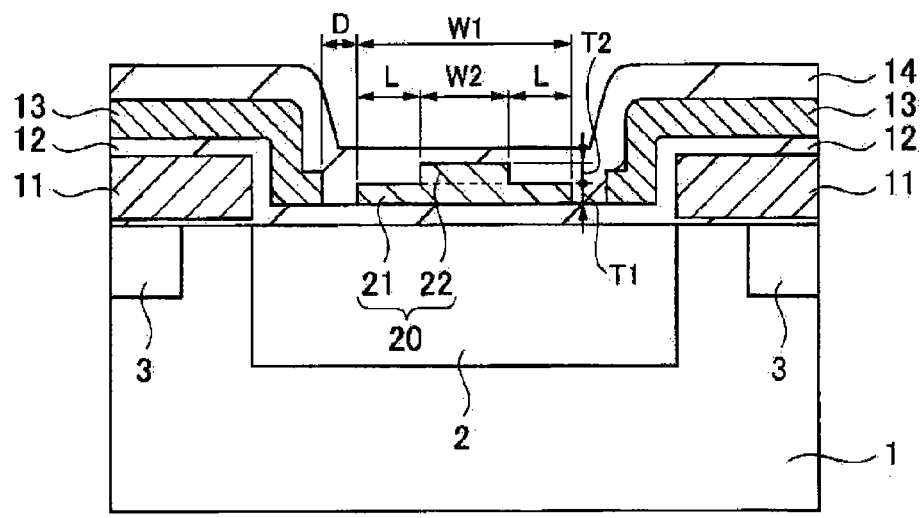
FIG. 2 is a diagram showing a convex shaped anti-reflection film of the solid-state imaging element of FIG. 1 and a dimension of each portion at its periphery.

As shown in FIG. 2, a width of the lower stage 21 of the anti-reflection film 20 is represented by W1, a width of the upper stage 22 is represented by W2, a thickness of lower stage 21 is represented by T1, and a thickness of the upper stage 22 is represented by T2. Moreover, a length from an end of the lower stage 21 to an end of the upper stage 22 is represented by L, and a length from an open end of the light-shielding film 13 to the end of the lower stage 21 of the anti-reflection film 20 is represented by D.

The wider the width W1 of the lower stage 21 of the anti-reflection film 20, the greater the anti-reflection effect, and the higher sensitivity, but a difference between the width W1 of the lower stage 21 and the width W2 of the upper stage 22 is increased, thereby decreasing the lens effect of the anti-reflection film 20. When the lens effect is decreased, smear is likely to occur.

On the contrary, the narrower the width W1 of the lower stage 21 of the anti-reflection film 20, the greater the effect of suppressing smear, but the portion where the anti-reflection film 20 on the light receiving unit 2 does not exist increases, thereby decreasing sensitivity.

When the solid-state imaging element receives and detects visible light having a center wavelength of 550 nm, the length D from the open end of the light-shielding film 13 to the end of the lower stage 21 of the anti-reflection film 20 is set within the range of 50 nm to 100 nm, thereby improving a balance of sensitivity and the effect of suppressing smear.

Furthermore, a difference W1−W2 (=2L) between the width W1 of the lower stage 21 and the width W2 of the upper stage 22 of the anti-reflection film 20 is suitably set within the range of 50 nm to 200 nm.

Moreover, it is suitable that when the total film thickness (T1+T2) of the lower stage 21 and the upper stage 22 is thick, the width W2 of the upper stage 22 of the anti-reflection film 20 is decreased and when the total film thickness (T1+T2) is thin, the width W2 is increased so that a convex shaped cross-sectional area is constant.

It should be noted that in the present embodiment, the convex shaped anti-reflection film 20 may be formed in an island shape independently for each pixel and may be formed in a stripe shape continuously in pixels in the same column.

In the anti-reflection film between the pixels when the convex shaped anti-reflection film 20 is formed in a stripe shape, the anti-reflection film may be formed between the transfer electrode and the light-shielding film, as with a flat-plate anti-reflection film described in Japanese Patent Application Laid-Open No. HEI 10-256518, for example.

It should be noted that the convex shaped anti-reflection film 20 is not limited to the two-layer structure made of the lower stage 21 and the upper stage 22 shown in FIG. 1 and may be constituted of three or more layers.

Moreover, the thicknesses of the respective layers may be equal to or different from each other.

The materials of the respective layers may be equal to or different from each other.

For example, the convex shaped anti-reflection film 20 of the solid-state imaging element according to the present embodiment can be formed as described in the following.

Figure 3A:
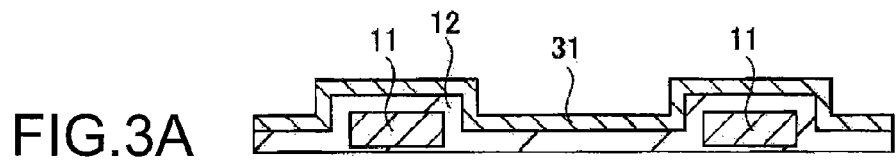
FIGS. 3A to 3F are process diagrams showing a method of forming the convex shaped anti-reflection film of the solid-state imaging element of FIG. 1.

First, as shown in FIG. 3A, after the transfer electrodes 11 and the interlayer insulating film 12 are sequentially formed, a first high-refractive index material film 31, for example, a SiN film, made of a material having a refractive index higher than that of the interlayer insulating films 12 is formed.

Figure 3B:
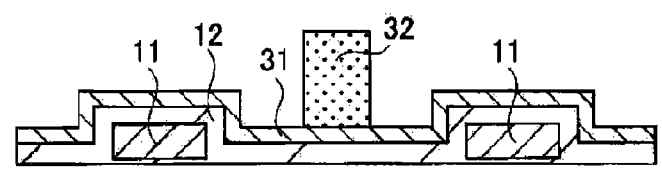

Next, as shown in FIG. 3B, a resist pattern 32 is formed on the first high-refractive index material film 31.

Figure 3C:
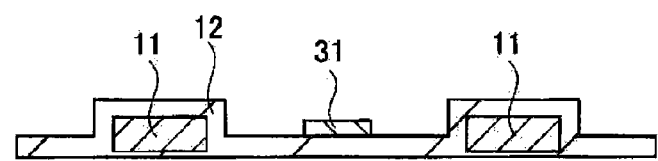

Then, the resist pattern 32 is used as a mask to pattern the first high-refractive index material film 31 by dry etching. Subsequently, the resist pattern 32 is removed, and the patterned first high-refractive index material film 31 is left as shown in FIG. 3C. At this time, the first high-refractive index material film 31 is narrower than the upper stage 22 of the convex shaped anti-reflection film 20 which is later formed.

Figure 3D:
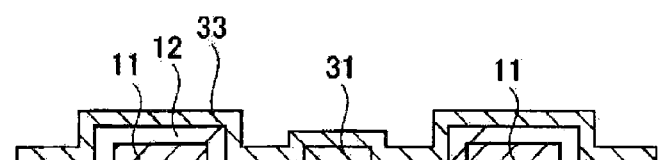

Next, as shown in FIG. 3D, a second high-refractive index material film 33, for example, a SiN film, made of a material having a refractive index higher than that of the interlayer insulating films 12 is formed by using the same material as that of the first high-refractive index material film 31.

Figure 3E:
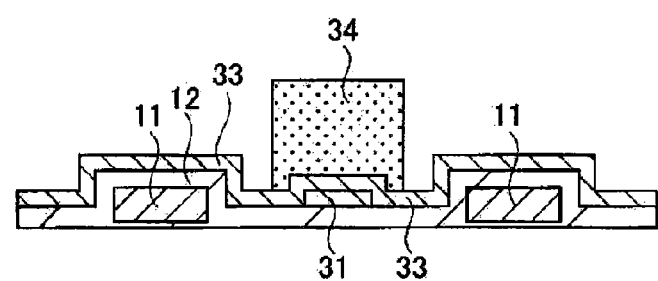

Next, as shown in FIG. 3E, a resist pattern 34 is formed on the second high-refractive index material film 33. The resist pattern 34 is wider than the resist pattern 32 shown in FIG. 3B and is formed in a pattern corresponding to the lower stage of the anti-reflection film 20.

Then, the resist pattern 34 is used as a mask to pattern the second high-refractive index material film 33 by dry etching. Subsequently, the resist pattern 34 is removed, and the patterned second high-refractive index material film 33 is left. Accordingly, as shown in FIG. 3F, it is possible to form the convex shaped anti-reflection film 20 formed by the first high-refractive index material film 31 and the second high-refractive index material film 33.

In this manufacturing method, the lower stage of the convex shaped anti-reflection film 20 is formed of the first high-refractive index material film 31 in a central portion and the second high-refractive index material film 33 in a peripheral portion, and the upper stage of the convex shaped anti-reflection film 20 is formed of the second high-refractive index material film 33.

Figure 3F:
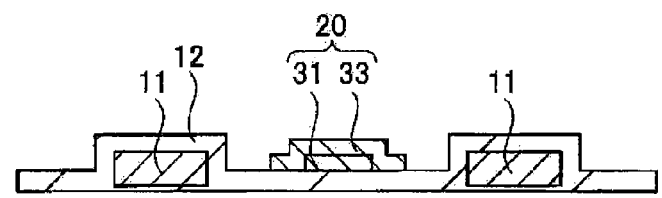

It should be noted that after the process shown in FIG. 3F, the same process as the process shown in FIGS. 3D to 3F is further repeated, so that an anti-reflection film having a three- or more-stage multilayer structure can be formed.

In the manufacturing method described above, the convex shaped anti-reflection film 20 is formed of only the high-refractive index material films 31 and 33.

In the present technology, the convex shaped anti-reflection film 20 may internally include a low-refractive index material film (for example, a silicon oxide film relative to a SiN film) having a refractive index lower than that of a high-refractive index material film.

Two methods of forming the anti-reflection film 20 for forming the structure in which the low-refractive index material film is included inside the anti-reflection film 20 will be described.

A first forming method of forming a structure in which the low-refractive index material film is included inside the anti-reflection film 20 will be described.

Figure 4A:
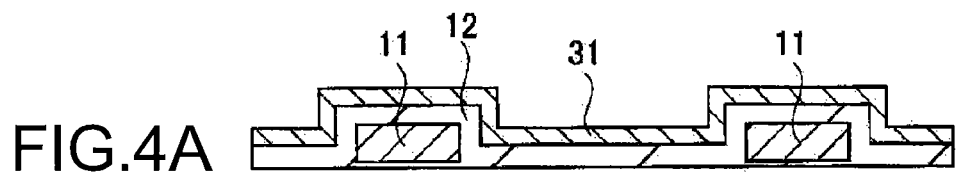
FIGS. 4A to 4G are process diagrams showing a first forming method of a structure in which a low-refractive index material film is included inside the convex shaped anti-reflection film.
Figure 4B:
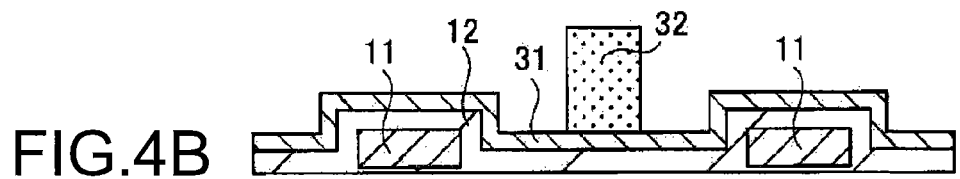
Figure 4C:
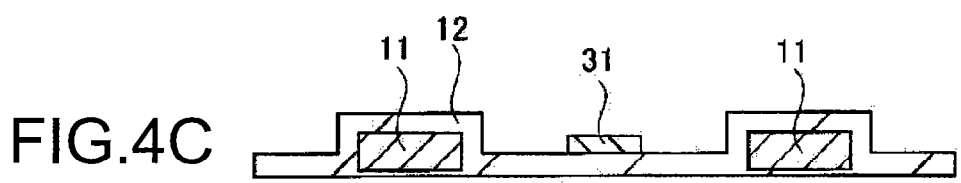

First, as shown in FIGS. 4A to 4C, the same process as that shown in FIGS. 3A to 3C is performed.

Figure 4D:
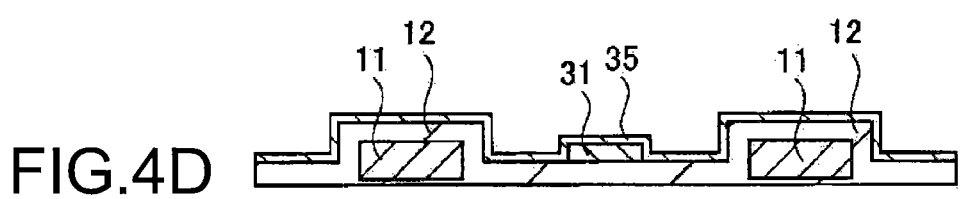

Next, as shown in FIG. 4D, a low-refractive index material film 35, for example, a silicon oxide film having a refractive index lower than that of the first high-refractive index material film 31 is entirely formed to cover the patterned first high-refractive index material film 31.

Figure 4E:
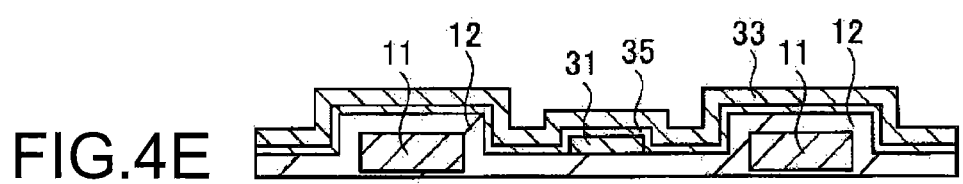

Next, as shown in FIG. 4E, on the low-refractive index material film 35, the second high-refractive index material film 33 is formed by using the same material as that of the first high-refractive index material film 31.

Figure 4F:
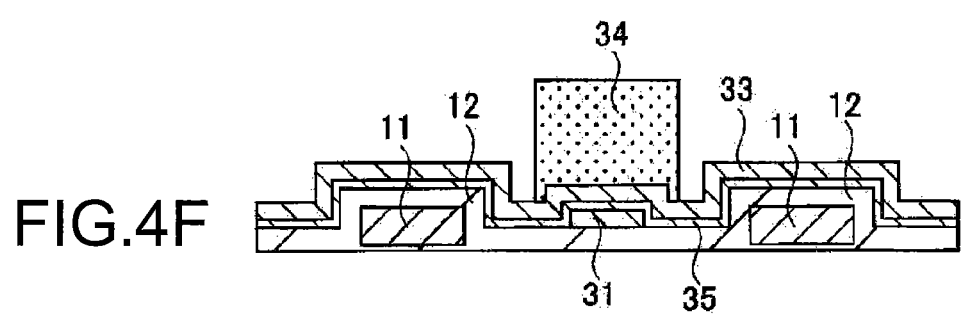

Next, as shown in FIG. 4F, on the second high-refractive index material film 33, a resist pattern 34 is formed. The resist pattern 34 is wider than the resist pattern 32 shown in FIG. 4B and is formed in a pattern corresponding to the lower stage of the anti-reflection film 20.

Then, the resist pattern 34 is used as a mask to pattern the second high-refractive index material film 33 by dry etching. Subsequently, the resist pattern 34 is removed, and the patterned second high-refractive index material film 33 is left. Accordingly, as shown in FIG. 4G, it is possible to form the convex shaped anti-reflection film 20 formed by the first high-refractive index material film 31, the low-refractive index material film 35, and the second high-refractive index material film 33.

It should be noted that in FIGS. 4D to 4G, the interlayer insulating films 12 and the low-refractive index material film 35 are described separately, but when these films are formed of the same material (for example, silicon oxide), they are integrally formed.

In this forming method, the lower stage of the convex shaped anti-reflection film 20 is formed of the first high-refractive index material film 31 in a central portion, and the low-refractive index material film 35 and the second high-refractive index material film 33 on its outside, and the upper stage of the convex shaped anti-reflection film 20 is formed of the second high-refractive index material film 33. Moreover, the central portion of the lower stage of the convex shaped anti-reflection film 20 has a configuration in which the low-refractive index material film 35 is formed between the first high-refractive index material film 31 and the second high-refractive index material film 33.

Figure 4G:
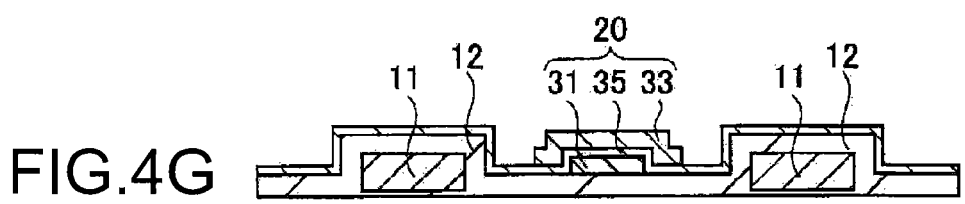

As shown in FIG. 4G, even if the low-refractive index material film 35 is formed between the first high-refractive index material film 31 and the second high-refractive index material film 33, a sufficient anti-reflection effect is obtained.

It should be noted that after the process shown in FIG. 4G, the same process as the process shown in FIGS. 4D to 4G is further repeated, so that an anti-reflection film having a three- or more-stage multilayer structure can be formed.

A second forming method of forming a structure in which the low-refractive index material film is included inside the anti-reflection film 20 will be described.

Figure 5A:
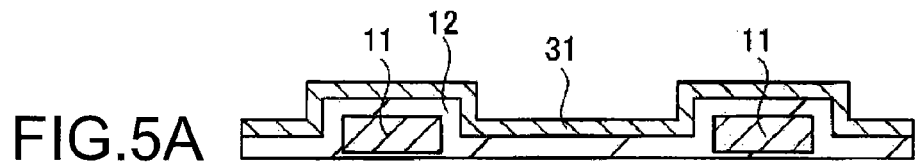
FIGS. 5A to 5G are process diagrams showing a second forming method of a structure in which a low-refractive index material film is included inside the convex shaped anti-reflection film.

First, as shown in FIG. 5A, the same process as that shown in FIG. 3A is performed.

Figure 5B:
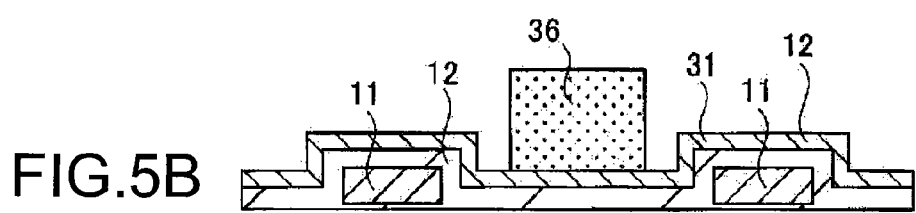

Next, as shown in FIG. 5B, on the first high-refractive index material film 31, a wide resist pattern 36 having a pattern corresponding to the lower stage of the anti-reflection film 20 is formed.

Figure 5C:
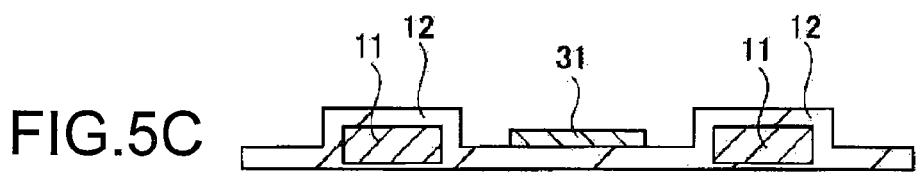

Then, the resist pattern 36 is used as a mask to pattern the first high-refractive index material film 31 by dry etching. Subsequently, the resist pattern 36 is removed, and the patterned first high-refractive index material film 31 is left as shown in FIG. 5C.

Figure 5D:
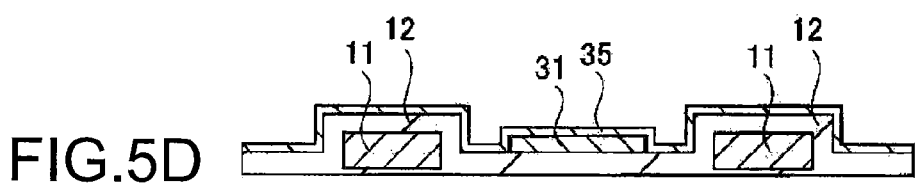

Next, as shown in FIG. 5D, the low-refractive index material film 35, for example, a silicon oxide film having a refractive index lower than that of the first high-refractive index material film 31 is entirely formed to cover the patterned first high-refractive index material film 31.

Figure 5E:
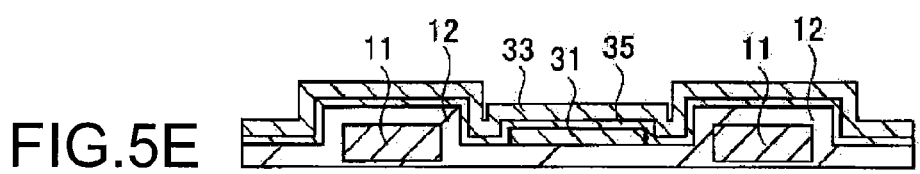

Next, as shown in FIG. 5E, on the low-refractive index material film 35, the second high-refractive index material film 33 is formed by using the same material as that of the first high-refractive index material film 31.

Figure 5F:
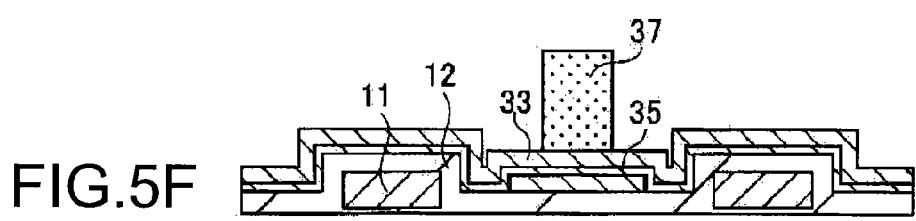

Next, as shown in FIG. 5F, on the second high-refractive index material film 33, a resist pattern 37 is formed. The resist pattern 37 is narrower than the resist pattern 36 shown in FIG. 5B and is formed in a pattern corresponding to the upper stage of the anti-reflection film 20.

Figure 5G:
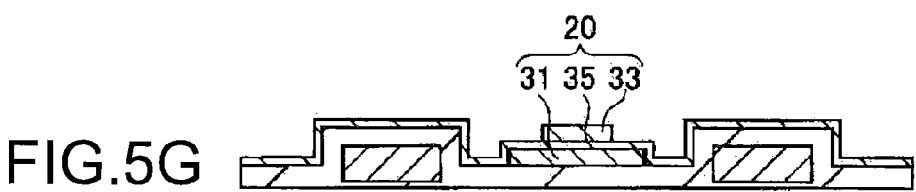

Then, the resist pattern 37 is used as a mask to pattern the second high-refractive index material film 33 by dry etching. Subsequently, the resist pattern 37 is removed, and the patterned second high-refractive index material film 33 is left. Accordingly, as shown in FIG. 5G, it is possible to form the convex shaped anti-reflection film 20 formed by the first high-refractive index material film 31, the low-refractive index material film 35, and the second high-refractive index material film 33.

It should be noted that in FIGS. 5D to 5G, the interlayer insulating films 12 and the low-refractive index material film 35 are described separately, but when these films are formed of the same material (for example, silicon oxide), they are integrally formed.

In this forming method, the lower stage of the convex shaped anti-reflection film 20 is formed of the first high-refractive index material film 31, and the upper stage of the convex shaped anti-reflection film 20 is formed of the second high-refractive index material film 33. Moreover, the central portion of the lower stage of the convex shaped anti-reflection film 20 has a configuration in which the low-refractive index material film 35 is formed between the first high-refractive index material film 31 and the second high-refractive index material film 33.

Moreover, when the second high-refractive index material film 33 is patterned, the first high-refractive index material film 31 in the lower stage is covered by the low-refractive index material film 35, so that the first high-refractive index material film 31 can be protected by the low-refractive index material film 35.

As shown in FIG. 5G, even if the low-refractive index material film 35 is formed between the first high-refractive index material film 31 and the second high-refractive index material film 33, a sufficient anti-reflection effect is obtained.

It should be noted that after the process shown in FIG. 5G, the same process as the process shown in FIGS. 5D to 5G is further repeated, so that an anti-reflection film having a three- or more-stage multilayer structure can be formed.

In the respective forming methods described above, even if a film thickness of each stage has an extremely thin film of about 10 nm, it is possible to form the convex shaped anti-reflection film 20.

When the anti-reflection film shaped in a curved-surface convex lens described in Japanese Patent Application Laid-Open No. 2006-41026 is formed, the curved surface shape of the resist is transferred, so that anisotropic etching is necessary.

On the contrary, in the above forming methods described in the present embodiment, it is possible to pattern the high-refractive index material films 31 and 33 by isotropic etching. Then, etching is performed under a condition of isotropic etching instead of anisotropic etching, so that damage to the interlayer insulating films 12 and the semiconductor base 1 can be eliminated at the time of etching.

Among the three forming methods described above, especially in the forming method shown in FIG. 3 and the forming method shown in FIG. 4, the portion left as the anti-reflection film 20 is protected by the resist pattern and is not exposed to etching. Accordingly, the etching damage to the anti-reflection film 20 is reduced and defects are reduced.

In each of the forming methods shown in FIGS. 3 to 5, a case has been explained in which the same material is used for the first high-refractive index material film 31 and the second high-refractive index material film 33.

In the present technology, mutually different high-refractive index materials can be used for the first high-refractive index material film 31 and the second high-refractive index material film 33.

Figure 6A:
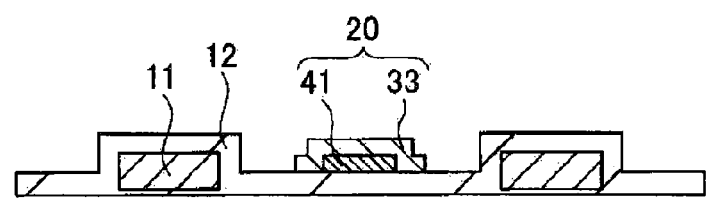
FIGS. 6A to 6C are diagrams showing a configuration of the anti-reflection film formed in a case where a first low-refractive index material film is formed by a material different from a second high-refractive index material film in the forming methods of FIGS. 3 to 5.
Figure 6B:
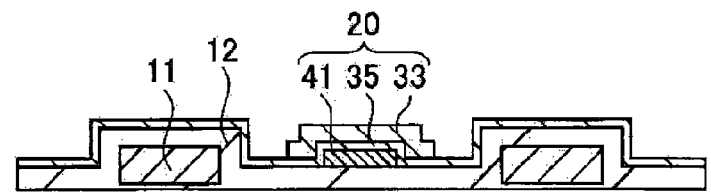
Figure 6C:
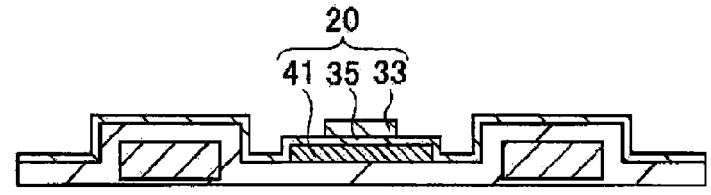

FIGS. 6A to 6C show configurations of the anti-reflection film 20 formed when a material different from the second high-refractive index material film 33 is used to form a first high-refractive index material film 41 in the forming methods shown in FIGS. 3 to 5. FIG. 6A shows a configuration corresponding to that of FIG. 3F, FIG. 6B shows a configuration corresponding to that of FIG. 4G, and FIG. 6C shows a configuration corresponding to that of FIG. 5G.

In FIGS. 6A to 6C, the opposing first high-refractive index material film 31 in FIGS. 3F, 4G, and 5G is replaced with the first high-refractive index material film 41, and the first high-refractive index material film 41 is different from the material of the second high-refractive index material film 33. For example, when a SiN film is used for the second high-refractive index material film 33, a SiON film, polyimide resin and the like can be used for the first high-refractive index material film 41.

According the configuration of the solid-state imaging element in the present embodiment described above, formed on the light receiving unit 2 is the convex shaped anti-reflection film 20 having a structure in which the two planar layers having the upper stage 22 narrower than the lower stage 21 are stacked. Since the upper stage 22 is narrower than the lower stage 21, the anti-reflection film 20 has a lens effect which collects light incident from above. Accordingly, focusing the light passed through the anti-reflection film 20 on the light receiving unit 2 can suppress the occurrence of smear and color mixing. Since the occurrence of smear and color mixing is suppressed, image quality can be improved.

Then, since reflection on the surface of the semiconductor base 1 can be suppressed by the anti-reflection film 20, it is possible to suppress sensitivity deterioration caused by the reflection and obtain sufficient sensitivity.

Moreover, according to the present embodiment, since the convex shaped anti-reflection film 20 is formed of the two planar layers having the lower stage 21 and the upper stage 22, processing is facilitated when the anti-reflection film 20 is formed. Accordingly, the width, thickness, and number of the planar layers constituting the anti-reflection film 20 can be selected arbitrarily and a higher degree of freedom in designing the anti-reflection film 20 can be provided.

Then, etching back the curved-surface shape anti-reflection film eliminates the need for a process of transferring the resist. Moreover, the films 31 and 33 constituting the anti-reflection film 20 under a condition of isotropic etching are etched, so that damage to the interlayer insulating films 12 and the semiconductor base 1 can be eliminated at the time of etching.

Accordingly, the interlayer insulating films 12 under the anti-reflection film 20 are formed to be relatively thin, and an anti-reflection condition based on the interlayer insulating films 12 and the anti-reflection film 20 can be optimized.

Therefore, according to the present embodiment, the anti-reflection film 20 can be designed to optimize a light focusing condition and the anti-reflection condition of the anti-reflection film 20.

2. Second Embodiment

Figure 7:
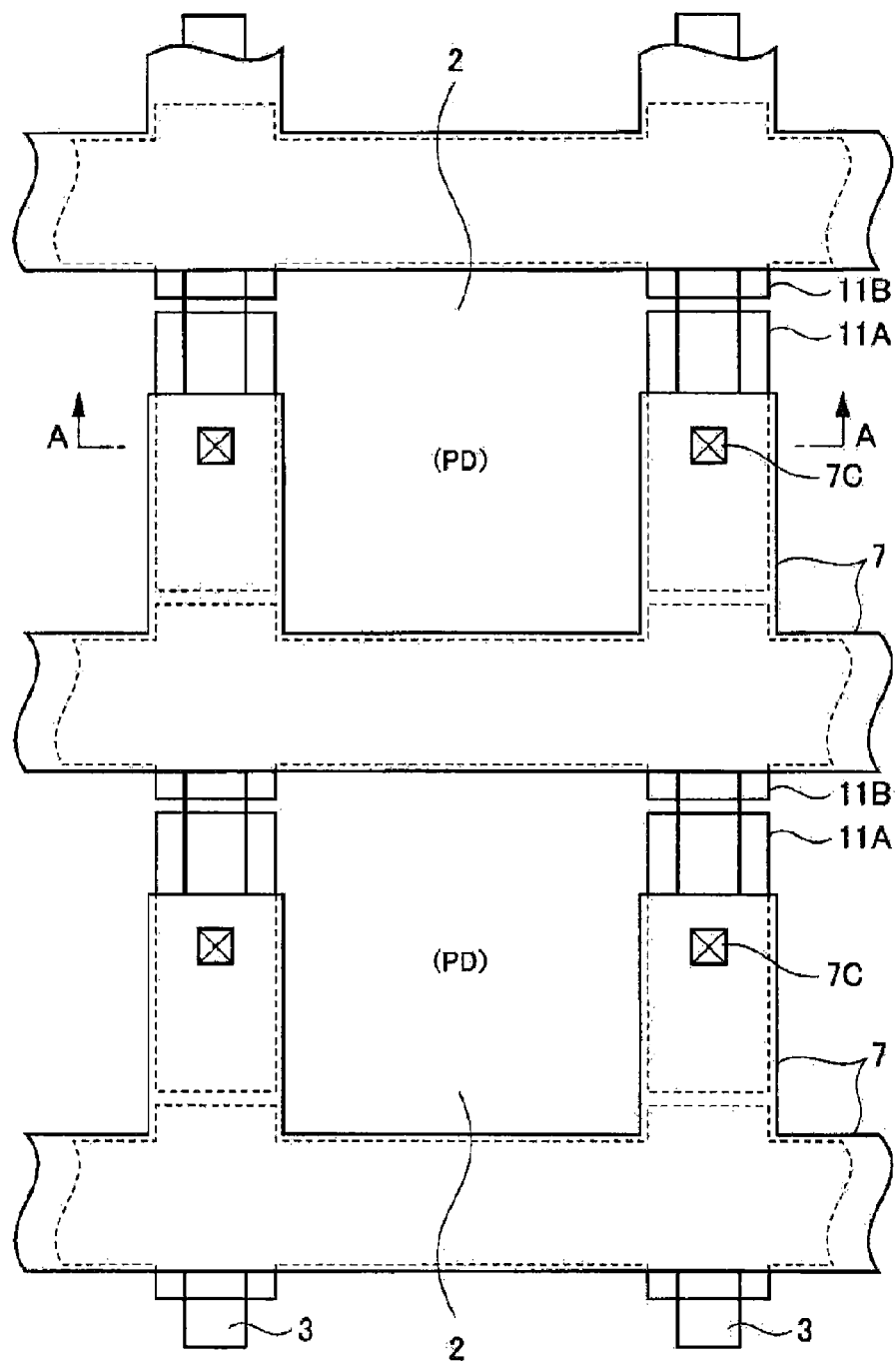
FIG. 7 is a schematic configuration diagram (plan view) of a solid-state imaging element according to a second embodiment.
Figure 8:
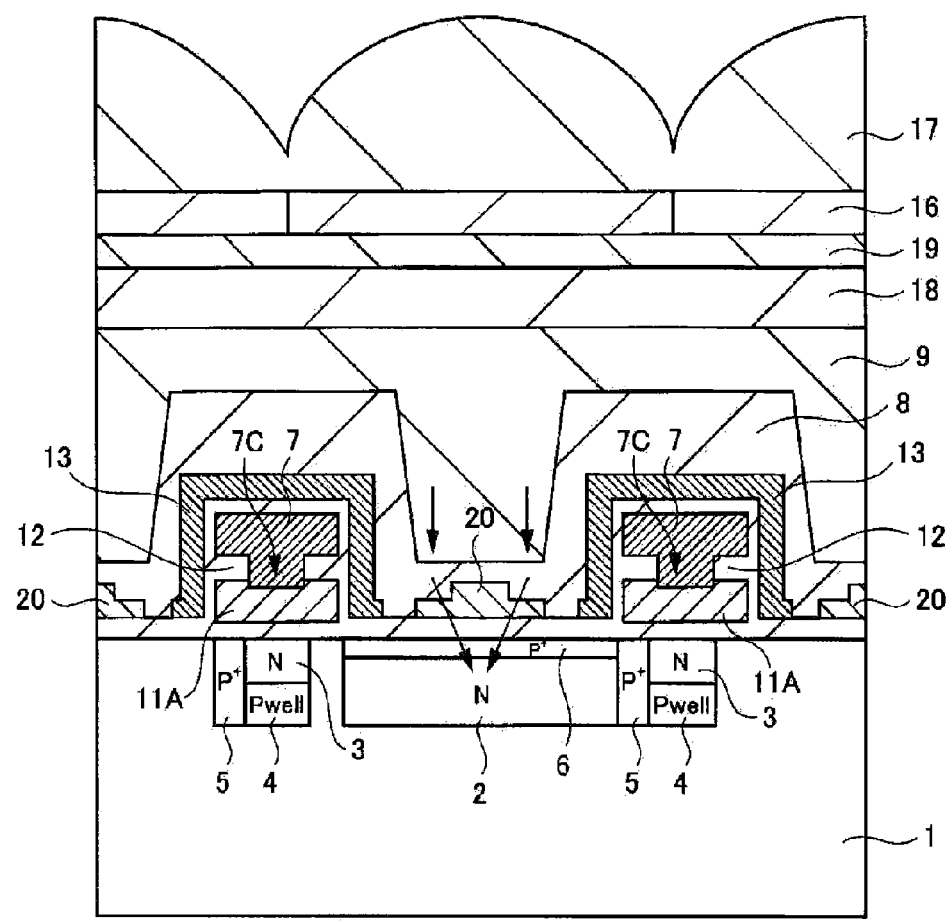
FIG. 8 is a cross-sectional view taken along the line A-A of FIG. 7.

FIGS. 7 and 8 show schematic configuration diagrams of a solid-state imaging element according to a second embodiment.

FIG. 7 shows a plan view of the solid-state imaging element and FIG. 8 shows a cross-sectional view taken along the line A-A of FIG. 7.

The present embodiment refers to a case where the present technology is applied to a CCD (charge coupled device) solid-state imaging element and further a waveguide is provided above the light receiving unit.

In the present embodiment, as shown in the plan view of FIG. 7, connection wirings 7 for supplying voltage to one side of the transfer electrode 11A are formed on transfer electrodes 11A and 11B.

Each of the transfer electrodes 11A and 11B is formed of a first electrode layer and has a single-layer electrode structure. One side of the transfer electrode 11A is formed on only the right and left sides of the light receiving unit 2. The other side of the transfer electrode 11B includes electrode portions formed along vertical transfer registers 3 which are disposed on the right and left sides of the light receiving unit and extends vertically, and wiring portions passing between the light receiving units 2 of the upper and lower pixels in FIG. 7 and extending horizontally.

The connection wirings 7 include the wiring portions passing between the light receiving units 2 of the upper and lower pixels in FIG. 7 and extending horizontally, and connecting portions extending along the transfer electrodes 11A and 11B. The connection wirings 7 are connected to the one side of the transfer electrode 11A through contact portions 7C of the connecting portions as shown in the cross-sectional view of FIG. 8.

As shown in the cross-sectional view of FIG. 8, the vertical transfer registers 3 made of N-type semiconductor regions are formed inside the semiconductor base 1 under the transfer electrode 11A, and Pwell regions 4 are formed under the vertical transfer registers 3.

The light receiving unit 2 is formed of an N-type semiconductor region and a positive electric charge accumulating region 6 made of a p+ semiconductor region is formed on its surface.

Between the light receiving unit 2 and the vertical transfer register 3 in the right, a P+ channel stop region 5 which separates these regions is formed.

A portion between the light receiving unit 2 and the vertical transfer register 3 in the left is a readout portion for reading out electric charges from the light receiving unit 2 to the vertical transfer register 3.

The interlayer insulating films 12 are formed to cover the transfer electrode 11A and the connection wirings 7, and the light-shielding films 13 are formed on the interlayer insulating films 12.

In the present embodiment, the convex shaped anti-reflection films 20 is formed on the interlayer insulating films 12 above the light receiving unit 2 as with the first embodiment.

The convex shaped anti-reflection film 20 can be configured in the same manner as the configuration described in the first embodiment.

Then, in the present embodiment, a waveguide constituted of a clad layer 8 made of a low-refractive index material and a core layer 9 made of a high-refractive index material is disposed above the light receiving unit 2 and further above the convex shaped anti-reflection film 20.

The clad layer 8 is formed to cover a stacked structure of the transfer electrode 11A, the connection wirings 7, the interlayer insulating films 12, and the light-shielding films 13, and the convex shaped anti-reflection film 20, respectively, and a concave portion is formed above the light receiving unit 2 and the anti-reflection film 20 along steps of the stacked structure.

The core layer 9 fills the concave portion of the clad layer 8 above the light receiving unit 2 and the anti-reflection film 20 and is formed on the clad layer 8.

For example, silicon oxide can be used for the low-refractive index material of the clad layer 8.

For example, SiN, SiON, SiCN, or polyimide resin can be used for the high-refractive index material of the core layer 9.

Then, the same high-refractive index material may be used for the high-refractive index material constituting the anti-reflection film 20 and the high-refractive index material of the core layer 9.

On the core layer 9, a passivation film 18, a planarizing film 19, a color filter 16, and a microlens 17 are formed from a lower layer.

In the present embodiment, the convex shaped anti-reflection film 20 is formed between the light receiving unit 2 and the waveguide. Accordingly, since the lens effect is produced in the convex shaped anti-reflection film 20, light passed through the waveguide is collected to the central portion and is incident on the light receiving unit 2 as shown by arrows in FIG. 8.

Figure 18:
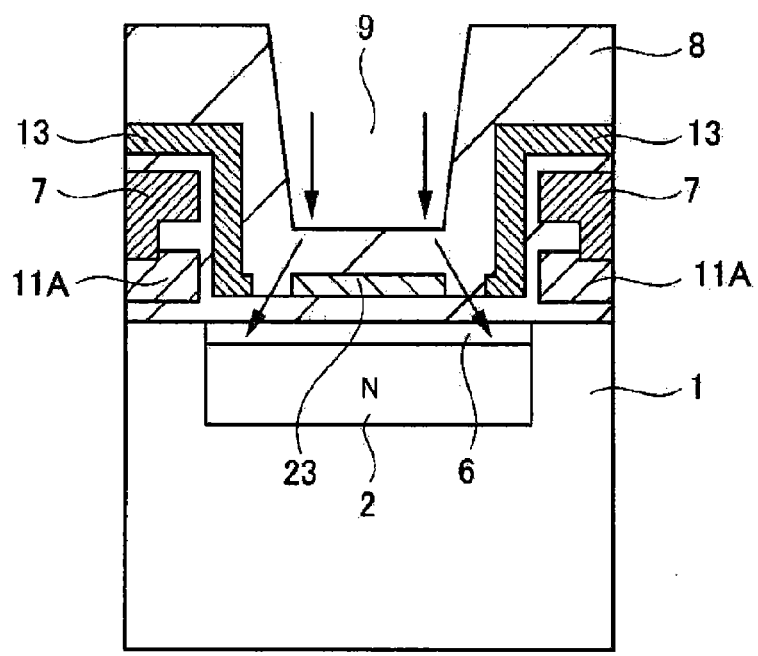
FIG. 18 is a cross-sectional view of the solid-state imaging element of a comparative example with respect to the second embodiment.

Herein, FIG. 18 shows a cross-sectional view in a case where a flat-plate anti-reflection film is provided between the light receiving unit 2 and the waveguide as a comparative example with respect to the configuration of the present embodiment.

As shown in FIG. 18, the flat-plate anti-reflection film 23 is formed under the waveguide of the core layer 9 inside the concave portion of the clad layer 8.

In this configuration, as shown by arrows in FIG. 18, among the light passed through the waveguide, some light scattered on a lower end of the waveguide and spread outside is not incident on the anti-reflection film 23. Therefore, the light is reflected between the surface of the semiconductor base and the light-shielding films 13, enters the vertical transfer register, and becomes smear.

On the contrary, in the configuration of the present embodiment shown in FIG. 8, the light can be collected by the lens effect produced by the convex shaped anti-reflection film 20, so that the light which is not incident on the convex shaped anti-reflection film 20 and becomes noise can be reduced.

It should be noted that, a bottom surface of the waveguide is a horizontal surface in FIG. 8, but the bottom surface of the waveguide is not limited to the horizontal surface and may be other shapes.

Figure 9A:
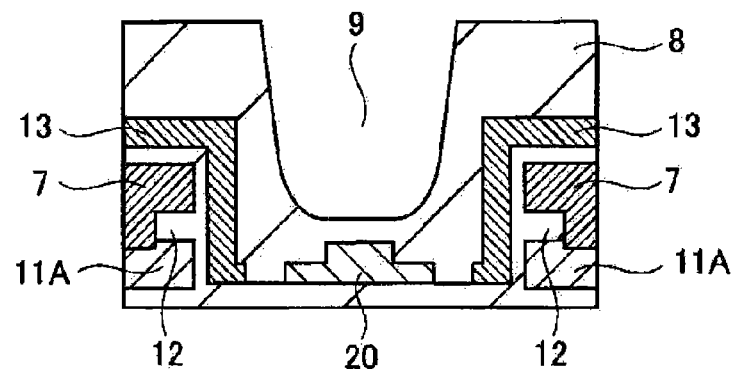
FIGS. 9A and 9B are diagrams showing an example of a bottom surface shape of a waveguide.
Figure 9B:
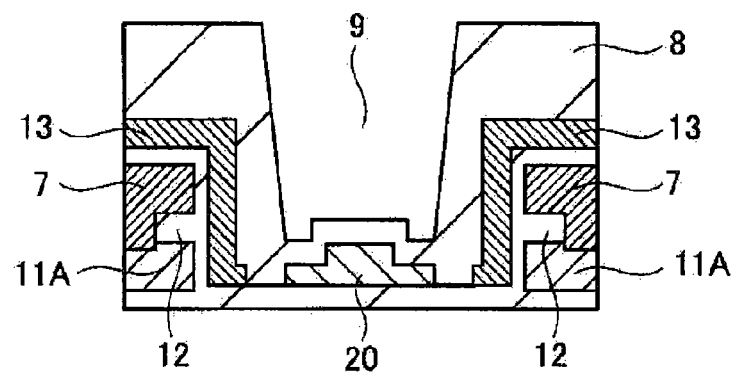

FIGS. 9A and 9B show an example of the bottom surface shape of such waveguide.

FIG. 9A shows an example in which the bottom surface of the waveguide is formed as a curved surface.

FIG. 9B shows an example in which the bottom surface of the waveguide is formed as a concave and convex surface along the convex shaped anti-reflection film 20.

According the configuration of the solid-state imaging element in the present embodiment described above, formed on the light receiving unit 2 is the convex shaped anti-reflection film 20 having a structure in which the two planar layers having the upper stage 22 narrower than the lower stage 21 are stacked as with the first embodiment.

Accordingly, as with the first embodiment, since it is possible to suppress the occurrence of smear and color mixing, image quality can be improved. Then, sensitivity deterioration caused by the reflection on the surface of the semiconductor base 1 is suppressed and sufficient sensitivity can be obtained.

Moreover, as with the first embodiment, the width, thickness, and number of the planar layers constituting the anti-reflection film 20 can be selected arbitrarily and a higher degree of freedom in designing the anti-reflection film 20 can be provided.

Moreover, according to the present embodiment, the waveguide constituted of the clad layer 8 and the core layer 9 is provided on the convex shaped anti-reflection film 20. Accordingly, a stray light component, incident on the clad layer 8, which becomes noise such as smear and color mixing in the flat-plate anti-reflection film of the related art configuration can be also focused on the convex shaped anti-reflection film 20. Accordingly, in addition to improvement of smear and color mixing, sensitivity can be also more highly improved.

The second embodiment described above has a configuration in which the present technology is applied to a CCD (charge coupled device) solid-state imaging element. However, even in a configuration in which the present technology is applied to a CMOS (complementary metal-oxide semiconductor) type solid-state imaging element, it is possible to provide the waveguide above the light receiving unit and the convex shaped anti-reflection film under an optical waveguide.

Figure 10:
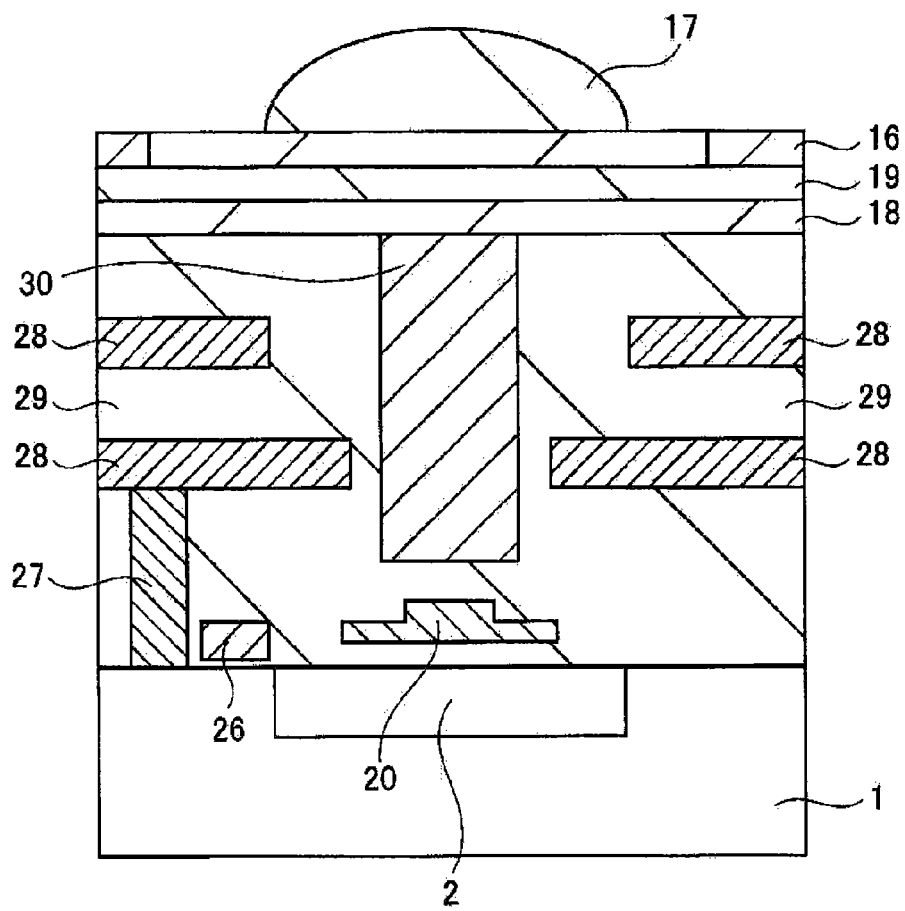
FIG. 10 is a cross-sectional view showing a configuration, applied to a CMOS type solid-state imaging element, in which a waveguide is provided above a light receiving unit.

FIG. 10 shows a schematic cross-sectional view in this case.

As shown in FIG. 10, the light receiving unit 2 is formed inside the semiconductor base 1 and a transfer gate 26 for transferring electric charge from the light receiving unit 2 is provided on the semiconductor base 1.

Above the semiconductor base 1, a wiring portion made of a plurality of wiring layers 28 and an insulating film 29 for insulating the wiring layers 28 is formed.

A plug layer 27 made of a conductor is connected to a portion at the left side of the transfer gate 26 of the semiconductor base 1, and the plug layer 27 electrically connects the wiring layers 28 in a lower layer of the wiring portion and a semiconductor region (not shown) inside the semiconductor base 1.

On the insulating film 29 of the wiring portion, the passivation film 18, the planarizing film 19, the color filter 16, and the microlens 17 are formed from a lower layer.

In a configuration shown in FIG. 10, especially, a trench is formed in the insulating film 29 constituting the wiring portion in an upper layer of the semiconductor base 1 on which the light receiving unit 2 is formed, and the trench is filled with a high-refractive index material layer 30 to form the waveguide. Then, under the waveguide, the convex shaped anti-reflection film 20 is provided.

Also in this configuration, since the light can be collected by the lens effect produced by the convex shaped anti-reflection film 20, it is possible to make the light scattered on the lower end of the waveguide and spread outside incident on the light receiving unit 2 and reduce the light which becomes noise.

3. Third Embodiment

FIGS. 11A and 11B show schematic configuration diagrams of a solid-state imaging element according to a third embodiment.

FIGS. 11A and 11B show cross-sectional views of a single pixel.

The present embodiment refers to a case where the present technology is applied to a CCD (charge coupled device) solid-state imaging element and further a waveguide is provided above the light receiving unit.

FIG. 11A shows a cross-sectional view of a blue pixel and FIG. 11B shows a cross-sectional view of red and green pixels.

As shown in FIG. 11A, in the blue pixel, the color filter 16 of blue B is formed and the flat-plate anti-reflection film 23 is formed in the same manner as shown in FIG. 18 under the waveguide formed of the clad layer 8 and the core layer 9.

As shown in FIG. 11B, in the red and green pixels, the color filters 16 of red R and the color filters 16 of green G are formed, and the convex shaped anti-reflection film 20 made of the lower stage 21 and the upper stage 22 is formed under the waveguide. In FIG. 11B, a thin film made of a low-reflectance material is formed between the lower stage 21 and the upper stage 22 of the anti-reflection film 20. That is, this configuration is the same as that shown in FIG. 5G.

Other configurations are the same as that of the second embodiment shown in FIG. 8 and a repeated explanation is omitted.

As shown in FIGS. 11A and 11B, the blue pixel, the red pixel, and the green pixel differ from one another in the configuration of the anti-reflection film. In the flat-plate anti-reflection film 23 of the blue pixel, the entire anti-reflection film is made thinner than the convex shaped anti-reflection film 20 of the red pixel and the green pixel.

Thus, the thickness of the anti-reflection film is changed corresponding to respective colors of the pixels, and in a case of the blue pixel with a short wavelength, an anti-reflection film is made thinner than other colors with a long wavelength, so that the anti-reflection effect of the anti-reflection film can be optimized.

It should be noted that in FIG. 11B, further in a case of the red pixel and the green pixel, the thicknesses of the lower stage 21 and the upper stage 22 of the convex shaped anti-reflection film 20 are allowed to be different from each other, and in a case of the green pixel, the thicknesses of the lower stage 21 and the upper stage 22 of the convex shaped anti-reflection film 20 can be made thinner than that of the red pixel.

Instead of changing the thicknesses of the lower stage 21 and the upper stage 22 of the anti-reflection film 20 corresponding to respective colors of the pixels, the number of stages (the number of layers) of the convex shaped anti-reflection film may be changed.

Moreover, not only the thickness of the anti-reflection film but also each layer width of the anti-reflection film may be changed corresponding to respective colors of the pixels.

Then, the configuration of the anti-reflection film is optimized for each pixel color, which makes it possible to improve sensitivity of all the pixels.

For example, in the blue pixel, the flat-plate anti-reflection film 23 is formed to be thinner than an ordinal flat-plate anti-reflection film and then a low-reflectance material film (interlayer insulating films 12 in FIG. 11) between the anti-reflection film 23 and the semiconductor base is formed to be thin, so that sensibility can be improved.

Moreover, in red and green pixels as well, the low-reflectance material film (interlayer insulating films 12 in FIG. 11) between the lower stage 21 of the anti-reflection film 20 and the semiconductor base thinner is formed to be thin, so that sensibility can be improved.

Furthermore, in FIG. 11A, the flat-plate anti-reflection film is formed in the blue pixel. However, the convex shaped anti-reflection film may be formed in the blue pixel in the same manner as the red and green pixels.

When the convex shaped anti-reflection film is also formed in the blue pixel, it is suitable that the upper stage width of the convex shaped anti-reflection film is formed so that the blue pixel is formed narrow, the red pixel is formed wide, and the green pixel is formed therebetween. Moreover, it is suitable that the total film thickness of the lower stage and the upper stage is formed so that the blue pixel is formed thin, the red pixel is formed thick, and the green pixel is formed therebetween.

Herein, with respect to the solid-state imaging element of the related art configuration in which the solid-state imaging element of the configuration of the present embodiment and the thickness of the flat-plate anti-reflection film for each pixel are the same, a condition of the material (refractive index) and the thickness of each layer is selected, optical simulation is performed, and the magnitude of sensitivity and smear is examined.

The setting condition is as follows.

Refractive index of a low-refractive index material (silicon oxide film): 1.4

Refractive index of a high-refractive index material (SiN film): 2.0

In the film thickness of each layer of the related art configuration in which the flat-plate anti-reflection film is used, each interlayer insulating film 12 (silicon oxide film) is set to 30 nm, the flat-plate anti-reflection film 23 (SiN film) is set to 40 nm, and the clad layer 8 is set to 70 nm.

In the film thickness of each layer in the blue pixel of the configuration according to the present embodiment, each interlayer insulating film 12 (silicon oxide film) is set to 10 nm, the flat-plate anti-reflection film 23 (SiN film) is set to 40 nm, and the clad layer 8 is set to 70 nm. In the film thickness of each layer in the red and green pixels, the interlayer insulating film 12 (silicon oxide film) is set to 10 nm, the lower stage 21 (SiN film) of the anti-reflection film is set to 40 nm, the silicon oxide film is set to 20 nm, the upper stage 22 (SiN film) of the anti-reflection film is set to 40 nm, and the clad layer 8 (silicon oxide film) is set to 50 nm. Moreover, a horizontal distance between the end portions of the lower stage 21 and the upper stage 22 (corresponding to the distance L in FIG. 2) is set to 150 nm.

It should be noted that the width of the flat-plate anti-reflection film 23 of the related art configuration and in the blue pixel is identical to the width of the lower stage 21 of the convex shaped anti-reflection film 20 in the red and green pixels.

Figure 12A:
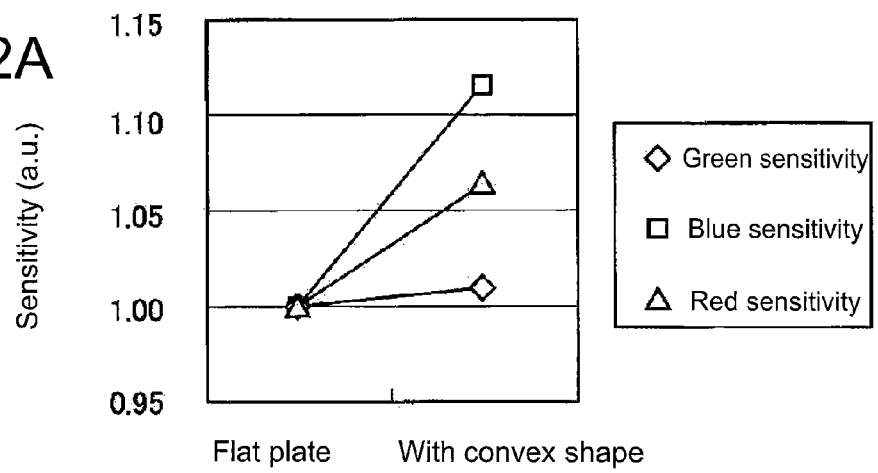
FIGS. 12A and 12B are diagrams showing results of sensitivity and smear obtained by optical simulation.
Figure 12B:
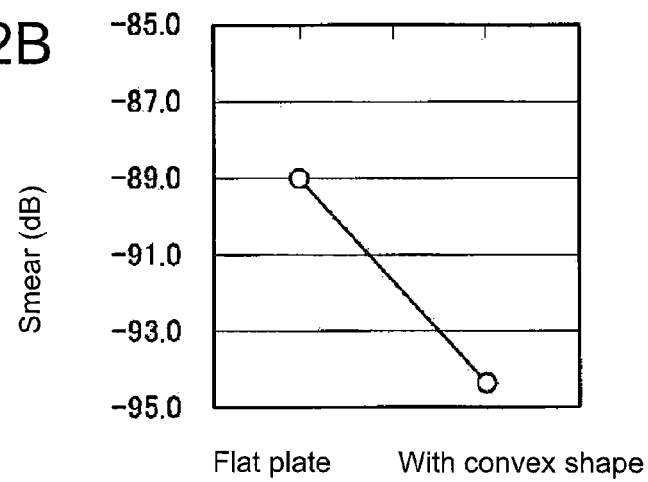

FIGS. 12A and 12B show results obtained by the optical simulation. FIG. 12A shows the result of sensitivity, and FIG. 12B shows the result of smear (dB). In FIGS. 12A and 12B, "flat plate" in the left shows the result of the related art configuration, and "with convex shape" in the right shows the result of the configuration of the present embodiment.

As shown in FIG. 12A, it can be seen that since the configuration of the present embodiment is employed, the sensitivity of each color is improved.

With regard to the blue pixel, a simple reduction in the thickness of the interlayer insulating films 12 under the flat-plate anti-reflection film 23 results in remarkably improving sensitivity.

With regard to the red and green pixels, since the convex shaped anti-reflection film 20 is further employed, sensitivity is improved.

It should be noted that for comparison, the configuration in which the red and blue pixels are configured in the same manner as the blue pixel is also examined, but sensitivity is not improved.

Moreover, as shown in FIG. 12B, when the configuration of the present embodiment is employed, it can be seen that smear is remarkably improved.

Furthermore, under the condition that making parallel light having a wavelength of 550 nm incident on the green pixel in which the film thickness of the upper stage 22 of the convex shaped anti-reflection film 20 is fixed to 40 nm and the width of the lower stage 21 of the convex shaped anti-reflection film 20 is fixed to 500 nm, respectively, the width of the upper stage 22 and the film thickness of the lower stage 21 are changed and the optical simulation is performed.

As a result, with regard to the optimal value of the width of the upper stage 22 and the film thickness of the lower stage 21, the film thickness is 50 nm when the width is 150 nm, the film thickness is 40 nm when the width is 200 nm, and the film thickness is 30 nm when the width is 250 nm.

Moreover, in this case, respective light focusing characteristics are almost the same.

In the solid-state imaging element of the present embodiment, in a case of configuration in which visible light having a center wavelength of 550 nm is imaged, a suitable range of the film thickness of each layer is as follows.

Interlayer insulating films 12 under the anti-reflection films 20 and 23: 30 nm or less Flat-plate anti-reflection film 23 of the blue pixel: 20 nm to 60 nm Clad layer 8 of the blue pixel: 30 nm to 90 nm Lower stage 21 of the anti-reflection film of the red and green pixels: 20 nm to 50 nm Oxide film between the anti-reflection films of the red and green pixels: 20 nm or less Upper stage 22 of the anti-reflection film of the red and green pixels: 20 nm to 50 nm Clad layer 8 of the red and green pixels: 30 nm to 70 nm According to the present embodiment described above, the convex shaped anti-reflection film 20 having a structure in which the two planar layers having the upper stage 22 narrower than the lower stage 21 are stacked is formed as with the present embodiments described earlier.

Accordingly, since it is possible to suppress the occurrence of smear and color mixing, image quality can be improved. Then, sensitivity deterioration caused by the reflection on the surface of the semiconductor base 1 is suppressed and sufficient sensitivity can be obtained. Moreover, the width, thickness, and number of the planar layers constituting the anti-reflection film 20 can be selected arbitrarily and a higher degree of freedom in designing the anti-reflection film 20 can be provided.

Moreover, according to the present embodiment, the waveguide constituted of the clad layer 8 and the core layer 9 is provided on the convex shaped anti-reflection film 20 as with the second embodiment. Accordingly, a stray light component incident on the clad layer 8 can be also focused on the convex shaped anti-reflection film 20 as with the second embodiment. Therefore, in addition to improvement of smear and color mixing, sensitivity can be also more highly improved.

Further, according to the present embodiment, dimensions such as the thickness of each planar layer of the anti-reflection film, and the thickness of the entire anti-reflection film, and the width of the planar layer are selected for each pixel color of the red R, the green G, and the blue B.

Accordingly an anti-reflection condition and sensitivity can be optimized for each pixel color. For example, as shown in FIG. 12A, sensitivity can be optimized in the pixels in all the colors.

In the present technology, since the convex shaped anti-reflection film is constituted by stacking the plurality of planar layers so that the upper layer is narrower than the lower layer, the anti-reflection film is easily formed. Therefore, the selection for the dimension of the anti-reflection film color can be easily realized for each pixel.

Fourth Embodiment

Subsequently, a solid-state imaging element according to a fourth embodiment will be described.

The present embodiment shows a case where a convex shaped anti-reflection film is formed by pupil correction.

Figure 13A:
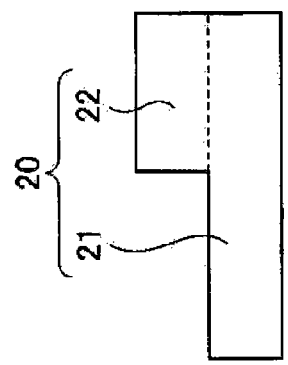
FIGS. 13A to 13C are cross-sectional views of a convex shaped anti-reflection film of a solid-state imaging element according to a fourth embodiment.
Figure 13B:
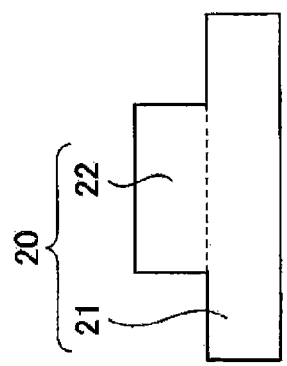
Figure 13C:
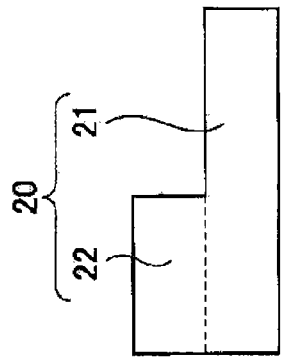

FIGS. 13A to 13C show cross-sectional shapes of the convex shaped anti-reflection film, in a case where the pupil correction is performed corresponding to a position of a pixel in a pixel portion, in the solid-state imaging element according to the fourth embodiment.

As shown in FIG. 13A, in the pixel at the left end of the pixel portion, the upper stage 22 of the convex shaped anti-reflection film 20 is formed closer to the right end of the lower stage 21.

As shown in FIG. 13B, in a central pixel of the pixel portion, the upper stage 22 of the convex shaped anti-reflection film 20 is formed on the center of the lower stage 21.

As shown in FIG. 13C, in the pixel at the right end of the pixel portion, the upper stage 22 of the convex shaped anti-reflection film 20 is formed closer to the left end of the lower stage 21.

It should be noted that in FIGS. 13A and 13C, an end surface of the lower stage 21 and an end surface of the upper stage 22 are aligned at the same position, but the position of the end surfaces of the upper and the lower stages is not limited to the same position.

Thus, by performing the pupil correction, a shading characteristic can be improved.

When the convex shaped anti-reflection film 20 having this configuration is manufactured, the upper stage of the convex shaped anti-reflection film 20 may be displaced so as to correspond to the pupil correction in the manufacturing processes shown in FIGS. 3B to 3C, 4B to 4C, and 5F, for example.

Also in the present embodiment, the convex shaped anti-reflection film 20 may be formed in an island shape independently for each pixel and may be formed in a stripe shape continuously in pixels in the same column.

Figure 14:
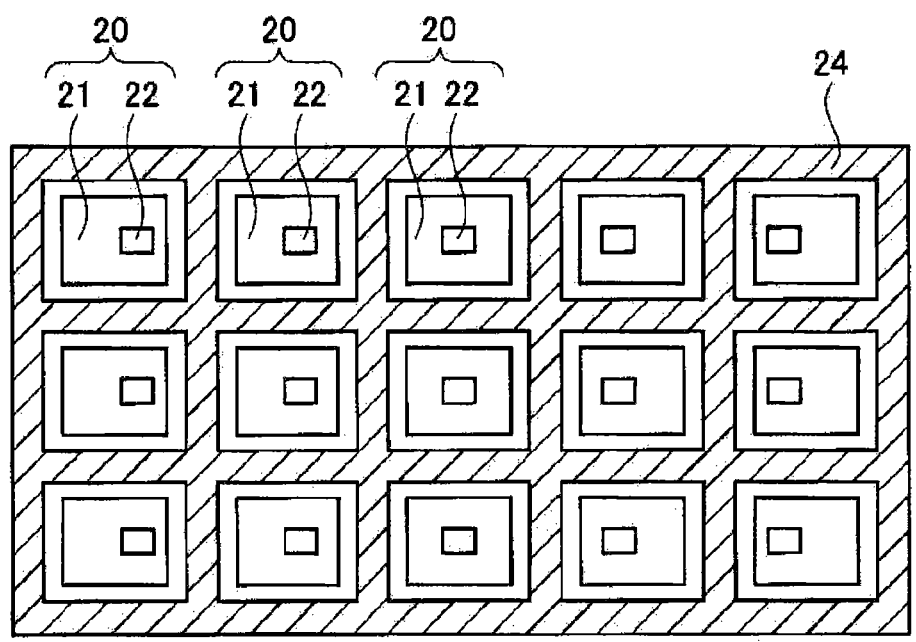
FIG. 14 is a diagram showing an example of a plane pattern in a case where the convex shaped anti-reflection film is formed in an island shape according to the fourth embodiment.
Figure 15:
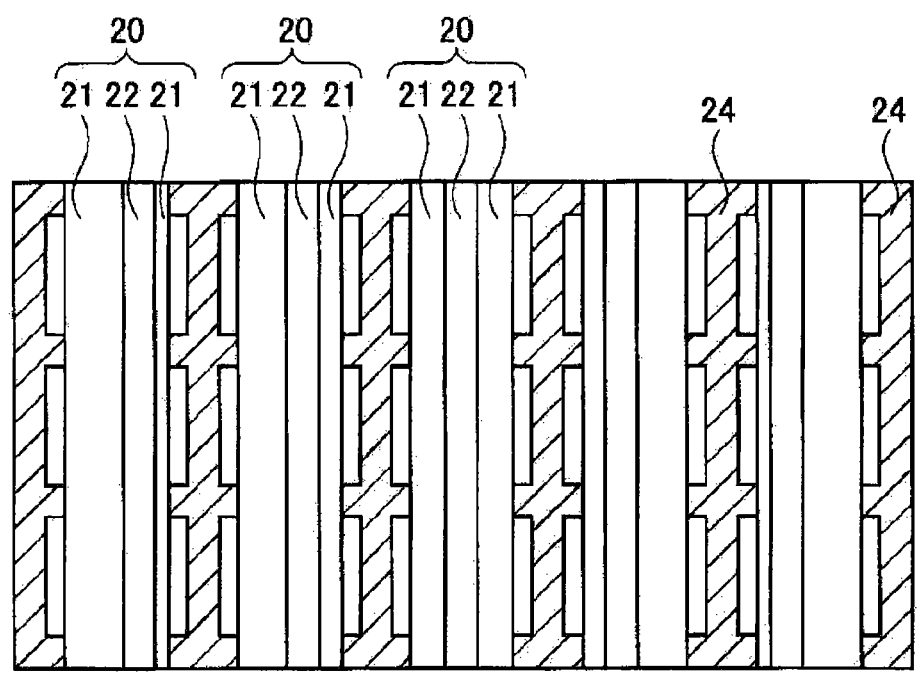
FIG. 15 is a diagram showing an example of a plane pattern in a case where the convex shaped anti-reflection film is formed in a stripe shape according to the fourth embodiment.

FIGS. 14 and 15 shows an example of a plane pattern in a case where the convex shaped anti-reflection film 20 is formed in each shape in the present embodiment.

FIG. 14 shows the plane pattern in a case where the convex shaped anti-reflection film 20 is formed in an island shape independently for each pixel. In FIGS. 14 and 15, a reference symbol 24 denotes a light-shielding member such as a light-shielding film and a metal wiring layer.

The convex shaped anti-reflection film 20 is formed independently for each pixel, and the upper stage 22 of the anti-reflection film 20 is displaced in the horizontal direction so as to correspond to the pupil correction.

FIG. 15 shows the plane pattern in a case where the convex shaped anti-reflection film 20 is formed continuously in pixels in the same column.

The convex shaped anti-reflection film 20 is formed in a stripe shape continuously in pixels in the same column, and the upper stage 22 of the anti-reflection film 20 is displaced in the horizontal direction so as to correspond to the pupil correction.

It should be noted that with regard to the anti-reflection film between the pixels when the convex shaped anti-reflection film is formed in a stripe shape, the anti-reflection film may be formed between the transfer electrode and the light-shielding film as described above, for example, in a CCD (charge coupled device) solid-state imaging element. In a CMOS (complementary metal-oxide semiconductor) type solid-state imaging element, the anti-reflection film may be formed under the wiring layer serving as a light-shielding member.

In the present embodiment, a manner of a change in pupil correction amount based on the pixel position in a field angle is not particularly limited and may appropriately be set.

For example, both of a configuration in which the pupil correction amount is linearly changed and a configuration in which the pupil correction amount is nonlinearly changed with respect to a positional relationship in the field angle (a distance relative to the central position of the field angle and the like) are possible.

It should be noted that an optimal value of the pupil correction amount depends on an F value (an oblique incident angle) in pursuit of a camera design.

Light close to parallel light reduces the pupil correction amount.

For example, in a case where light having a large F value such as F=2.8 is pursued, the pupil correction amount is increased. However, the upper stage of the anti-reflection film is inhibited from protruding horizontally from the lower stage, so that the maximum pupil correction amount is set up to [(the lower stage−the upper stage)÷2].

In the manufacturing method of the configuration described in Japanese Patent Application Laid-Open No. 2006-41026, the curved-surface shape of the resist is transferred to the anti-reflection film between the previously formed transfer electrodes. Therefore, if pupil correction is performed on the curved-surface shape anti-reflection film, a bilaterally asymmetric lens may be produced.

In particular, finer pixel sizes are more likely to cause the phenomenon.

In the present technology, the anti-reflection film of a multilayer structure having steps instead of a curved-surface shape is employed, so that the width and position of the upper stage can only be controlled by pupil correction. Therefore, even if the transfer electrodes are previously formed, the anti-reflection film to which pupil correction is performed can be formed without problems.

According to the present embodiment described above, the convex shaped anti-reflection film 20 having a structure in which the two planar layers having the upper stage 22 narrower than the lower stage 21 are stacked is formed as with the present embodiments described earlier.

Accordingly, since it is possible to suppress the occurrence of smear and color mixing, image quality can be improved. Then, sensitivity deterioration caused by the reflection on the surface of the semiconductor base 1 is suppressed and sufficient sensitivity can be obtained. Moreover, the width, thickness, and number of the planar layers constituting the anti-reflection film 20 can be selected arbitrarily and a higher degree of freedom in designing the anti-reflection film 20 can be provided.

Moreover, according to the present embodiment, since a relative position of the planar layer of the upper stage 22 with respect to the planar layer of the lower stage 21 of the convex shaped anti-reflection film 20 is corrected corresponding to the position of the pixel in the pixel portion, the occurrence of shading can be suppressed by the convex shaped anti-reflection film 20.

The configuration in which pupil correction is performed on the convex shaped anti-reflection film 20 according to the present embodiment can be applied to the configurations of the embodiments described earlier. For example, the waveguide can be formed on the convex shaped anti-reflection film 20 to which pupil correction is performed.

5. Fifth Embodiment

Figure 16:
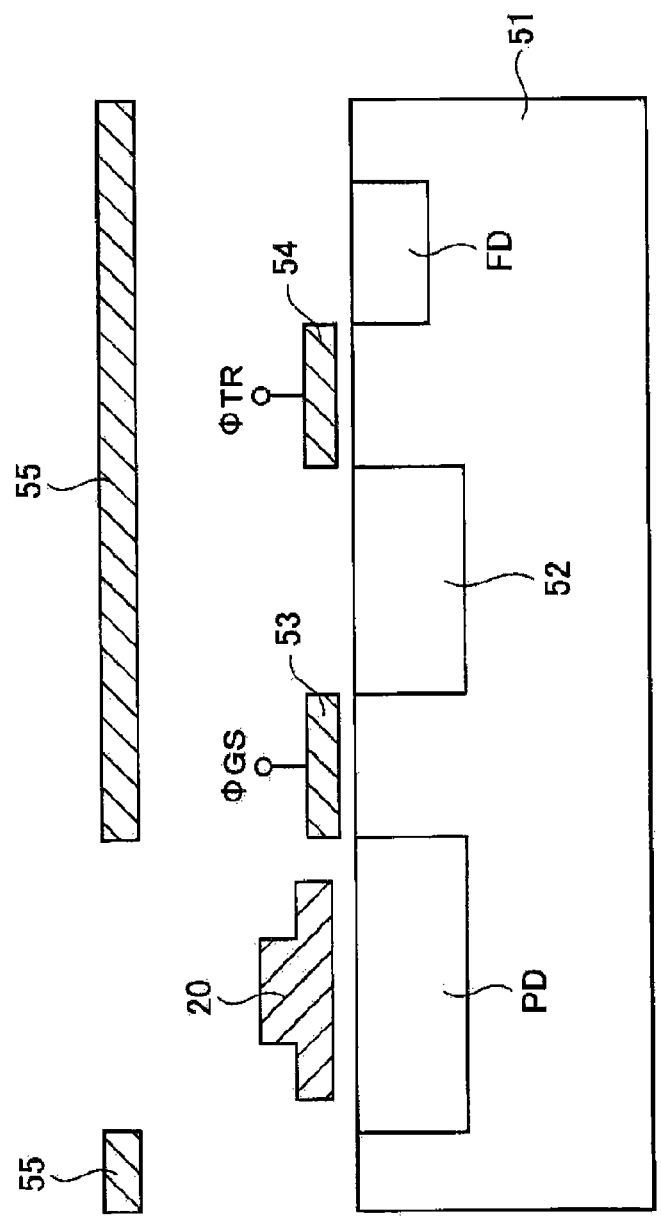
FIG. 16 is a schematic configuration diagram (cross-sectional view) of a solid-state imaging element according to a fifth embodiment.

FIG. 16 shows a schematic configuration diagram (cross-sectional view) of a solid-state imaging element according to a fifth embodiment.

The present embodiment exemplifies a case where the present technology is applied to the solid-state imaging element using a global shutter.

As shown in FIG. 16, a photodiode PD of a light receiving unit and a floating diffusion FD are formed in a semiconductor base 51.

Then, an electric charge accumulating region 52 is formed in the semiconductor base 51 between the photodiode PD and the floating diffusion FD.

A transfer gate 53 is formed above the semiconductor base 51 between the photodiode PD and the electric charge accumulating region 52. A global shutter signal φGS is supplied to the transfer gate 53.

A readout gate 54 is formed above the semiconductor base 51 between the electric charge accumulating region 52 and the floating diffusion FD. A readout signal φTR is supplied to the readout gate 54.

Then, a light-shielding film 55 is formed to cover above a portion other than the photodiode PD.

It should be noted that, illustration of the configuration above the light-shielding film 55 is omitted in FIG. 16. A color filter, a microlens and the like which are not shown are formed above the light-shielding film 55.

In the present embodiment, the convex shaped anti-reflection film 20 is formed above the photodiode PD under the light-shielding film 55.

In the configuration of the convex shaped anti-reflection film 20, the same configuration as that of the embodiments described earlier can be employed.

The global shutter signal φGS is simultaneously turned on in all the pixels, and electric charge photoelectrically converted by the photodiode PD is transferred to the electric charge accumulating region 52.

The readout signal φTR is turned on for each pixel column, and electric charge is read out from the electric charge accumulating region 52 to the floating diffusion FD for each pixel column.

According to the present embodiment described above, since the convex shaped anti-reflection film 20 is provided above the photodiode PD, incident light can be focused on the photodiode PD.

Accordingly, when the flat-plate anti-reflection film is provided, noise light incident on the electric charge accumulating region 52 can be reduced.

As described above, the present technology can be applied to both a CCD (charge coupled device) solid-state imaging element and a CMOS (complementary metal-oxide semiconductor) type solid-state imaging element.

Moreover, the present technology can be applied to the solid-state imaging element of any structure either a surface-illuminated structure or a back-illuminated structure.

In particular, a distance from the microlens to the light receiving unit is increased in the surface-illuminated structure, so that finer pixel sizes make it difficult to focus light sufficiently only by the waveguide. Therefore, employing the present technology has a great effect.

In the present technology, other than the combination of the waveguide and the convex shaped anti-reflection film described in the second embodiment, it is also possible to combine an inner-layer lens and the convex shaped anti-reflection film.

Furthermore, the configurations described in the above embodiments can be combined appropriately.

The solid-state imaging element according to an embodiment of the present technology can be applied to electronic apparatuses including, for example, a camera system such as a digital camera and a video camera, a mobile phone having an imaging function, or other apparatuses having an image function.

6. Sixth Embodiment

Figure 17:
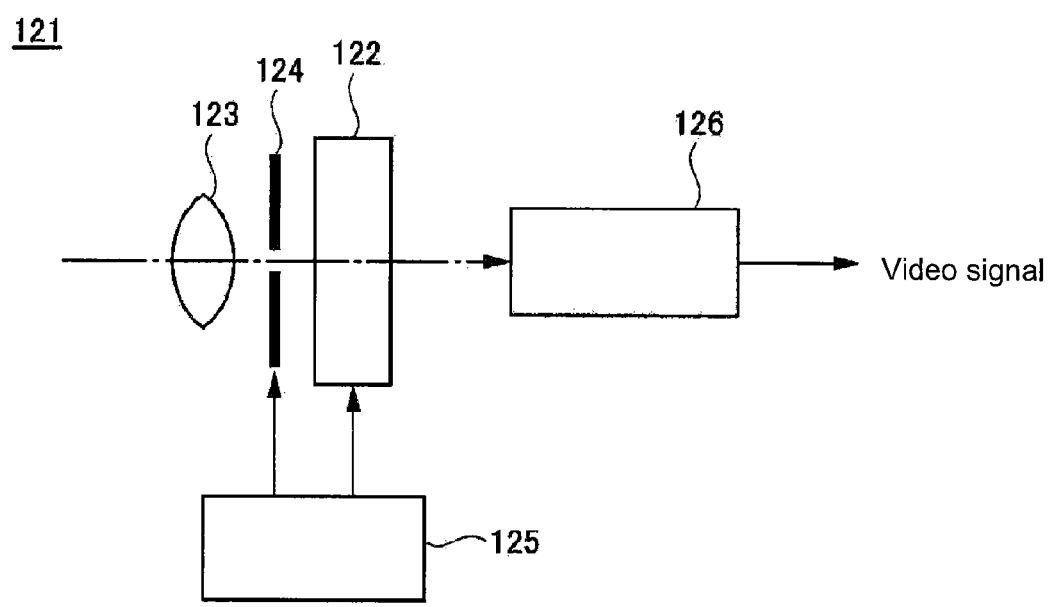
FIG. 17 is a schematic configuration diagram (block diagram) of an electronic apparatus according to a sixth embodiment.

FIG. 17 shows a schematic configuration diagram (block diagram) of an electronic apparatus according to a sixth embodiment.

The present embodiment exemplifies a case where the present technology is applied to the electronic apparatus including a camera capable of capturing a still image or a moving image.

As shown in FIG. 17, an electronic apparatus 121 includes a solid-state imaging element 122, an optical system 123, a shutter apparatus 124, a driving circuit 125, and a signal processing circuit 126.

The optical system 123 is constituted of an optical lens and the like, and images image light (incident light) from a subject on a pixel portion of the solid-state imaging element 122. As a result, a signal charge is accumulated in the solid-state imaging element 122 for a certain period of time. The optical system 123 may be an optical lens system constituted of a plurality of optical lenses.

As the solid-state imaging element 122, the solid-state imaging element according to an embodiment of the present technology such as the solid-state imaging element of the embodiments described above is employed.

The shutter apparatus 124 controls a light irradiation period and a light blocking time period to the solid-state imaging element 122.

The driving circuit 125 supplies a driving signal for controlling a transmission operation of the solid-state imaging element 122 and a shutter operation of the shutter apparatus 124. A signal transmission of the solid-state imaging element 122 is performed based on the driving signal (timing signal) supplied from the driving circuit 125.

The signal processing circuit 126 performs various kinds of signal processing. The video signal subjected to the various kinds of signal processing is stored in a storage medium such as a memory or output to a monitor.

According to the configuration of the electronic apparatus 121 of the present embodiment described above, as the solid-state imaging element 122, the solid-state imaging element according to an embodiment of the present technology such as the solid-state imaging element of the embodiments described above is employed. Accordingly, in the solid-state imaging element 122, it is possible to suppress the occurrence of smear and color mixing and sensitivity deterioration, caused by the reflection, improve an image quality, and ensure sufficient sensitivity.

In the present technology, the configuration of the electronic apparatus is not limited to the configuration shown in FIG. 17. As long as it is adapted to the configuration in which the solid-state imaging element according to an embodiment of the present technology is used, the configuration other than the configuration shown in FIG. 17 can be applied.

It should be noted that the present disclosure can be configured as follows.

(1) A solid-state imaging element includes a light receiving unit formed on a semiconductor base; and an anti-reflection film formed on the light receiving unit, the anti-reflection film having a plurality of planar layers whose planar layer in an upper layer is narrower than the planar layer in a lower layer.

(2) The solid-state imaging element according to Item (1), in which the anti-reflection film includes a film having a refractive index higher than a refractive index of the layer formed on the anti-reflection film.

(3) The solid-state imaging element according to Item (1) or (2), one of a width and a thickness of each of the planar layers is selected for each pixel color.

(4) The solid-state imaging element according to any one of Items (1) to (3), in which a relative position of the planar layer in the upper layer with respect to the planar layer in the lower layer is corrected corresponding to a position of a pixel in a pixel portion.

(5) The solid-state imaging element according to any one of Items (1) to (4), further including a waveguide formed above the anti-reflection film.

(6) An electronic apparatus, including an optical system; the solid-state imaging element according to any one of Items (1) to (5); and a signal processing circuit configured to process an output signal of the solid-state imaging element.

The present technology is not limited to the embodiments described above, but may take various variations and configurations without departing from the scope of the technology.

The present disclosure contains subject matter related to that disclosed in Japanese Priority Patent Application JP 2012-073725 filed in the Japan Patent Office on Mar. 28, 2012, the entire content of which is hereby incorporated by reference.

What is claimed is:

1. A solid-state imaging element, comprising:
a light receiving unit formed on a semiconductor base;
an anti-reflection film formed on the light receiving unit, the anti-reflection film having a plurality of planar layers whose planar layer in an upper layer is narrower than the planar layer in a lower layer; and
a waveguide formed above the anti-reflection film, wherein the waveguide comprises a clad layer and a core layer, the clad layer forming a concave portion above the anti-reflection film, and the core layer being formed on the clad layer and filling the concave portion of the clad layer.

2. The solid-state imaging element according to claim 1, wherein a width and a thickness of each of the plurality of planar layers is selected for each pixel color.

3. The solid-state imaging element according to claim 1, wherein the core layer having has a refractive index higher than a refractive index of the clad layer.

4. An electronic apparatus, comprising:
an optical system;
a solid-state imaging element including:
a light receiving unit formed on a semiconductor base;
an anti-reflection film formed on the light receiving unit, the anti-reflection film having a plurality of planar layers whose planar layer in an upper layer is narrower than the planar layer in a lower layer; and
a waveguide formed above the anti-reflection film, wherein the waveguide comprises a clad layer and a core layer, the clad layer forming a concave portion above the anti-reflection film, and the core layer being formed on the clad layer and filling the concave portion of the clad layer; and
a signal processing circuit configured to process an output signal of the solid-state imaging element.

5. The electronic apparatus according to claim 4, wherein a width and a thickness of each of the plurality of the planar layers is selected for each pixel color.

6. The electronic apparatus according to claim 4, wherein the core layer has a refractive index higher than a refractive index of the clad layer.

7. The solid-state imaging element according to claim 1, wherein the anti-reflection film includes a material film formed between and a first material film and a second material film, the first material film and the second material film each having a refractive index higher than a refractive index of the material film.

8. The solid-state imaging element according to claim 7, wherein the first material film and the second material film are formed of different material.

* * * * *